United States Patent [19]
Suzuki et al.

[11] 4,200,393
[45] Apr. 29, 1980

[54] METHOD OF POSITIONING A SEMICONDUCTOR MEMBER BY EXAMINING IT AND A DIE BONDING APPARATUS USING THE SAME

[75] Inventors: Etsuji Suzuki; Itaru Yasue; Tomio Kashihama, all of Yokohama, Japan

[73] Assignee: Tokyo Shibaura Elecric Co., Ltd., Japan

[21] Appl. No.: 804,441

[22] Filed: Jun. 7, 1977

[30] Foreign Application Priority Data

Jun. 7, 1976 [JP] Japan ................................ 51-65607
Jun. 7, 1976 [JP] Japan ................................ 51-65608

[51] Int. Cl.$^2$ ...................... G01N 21/32; G01B 11/26
[52] U.S. Cl. ...................................... 356/73; 250/578; 356/400
[58] Field of Search .................. 356/73, 164, 167, 172, 356/237, 375; 250/202, 561, 578; 350/81; 364/559–560; 318/577; 214/1 PE

[56] References Cited

U.S. PATENT DOCUMENTS

| | | | |
|---|---|---|---|
| 3,571,796 | 3/1971 | Brugger | 250/578 |
| 3,752,589 | 8/1973 | Kobayashi | 350/81 |
| 3,778,131 | 12/1973 | Wanesky | 350/81 |
| 4,075,605 | 2/1978 | Hilley et al. | 340/146.3 AC |

OTHER PUBLICATIONS

Khoury, H. H. "2–D Area Array Solid–State Feedback Automatic Wafer Alignment System", IBM Tech. Disc. Bull. 3-1975, pp. 2890-2892.
Reich et al., "High Speed Profile Measurement with Electro-Optics", Optical Engineering, vol. 15, 1,2-76, pp. 44-47.

*Primary Examiner*—John K. Corbin
*Assistant Examiner*—Wm. H. Punter
*Attorney, Agent, or Firm*—Finnegan, Henderson, Farabow, Garrett & Dunner

[57] ABSTRACT

According to the present method of positioning a semiconductor member by examining it, an optical image of the semiconductor member is focussed on a photoelectric conversion face formed by having a plurality of photoelectric conversion elements arranged thereon in the form of a matrix. By means of the photoelectric conversion elements spotlighted by said optical image, the distributions of the spotlighted elements and the remaining non-spotlighted elements are examined through scanning operation. By using the examination results, a table having said semiconductor members loaded thereon is so moved as to permit one of them to fall under the photoelectric conversion face, thereby to inspect for positioning examination of the semiconductor member the presence or absence of a defect-indicating mark affixed thereto and examine the qualification or non-qualification of the member in terms of outer dimension, in terms of the position taken after moved, and in terms of whether or not the semiconductor member can be subjected to correction of the position, or is damaged, or is cracked, or is stained or is partially oversized. Thus, according to the present method, only each qualified one of the semiconductor members can be positioned precisely in a prescribed position, and a die bonding apparatus of the invention is based on the using of the above method for purpose of positioning the semiconductor member by examining it.

14 Claims, 24 Drawing Figures

F I G. 3
F I G. 6a
F I G. 6b
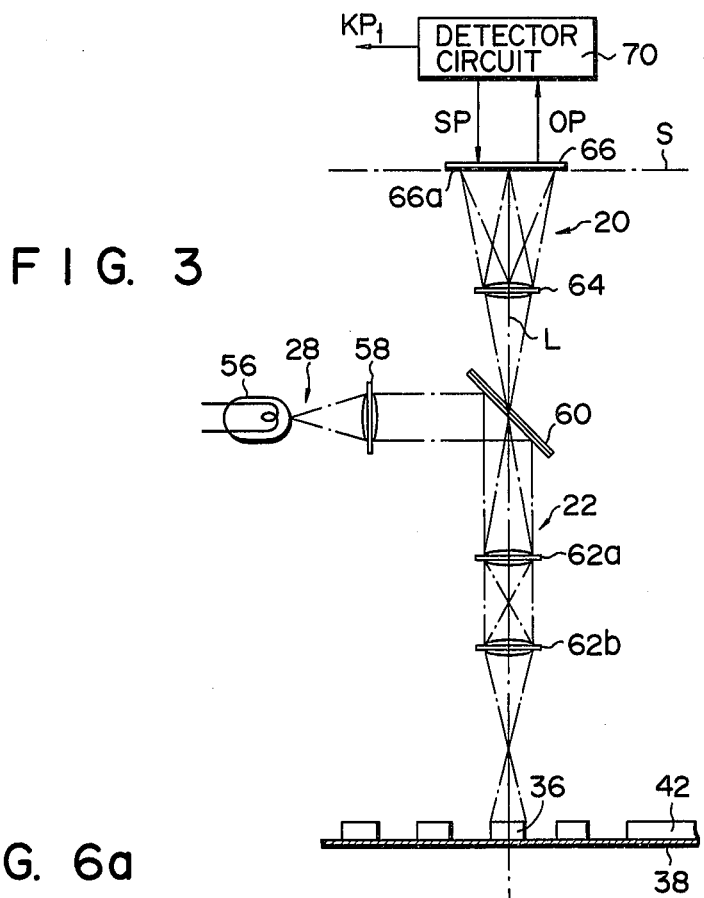
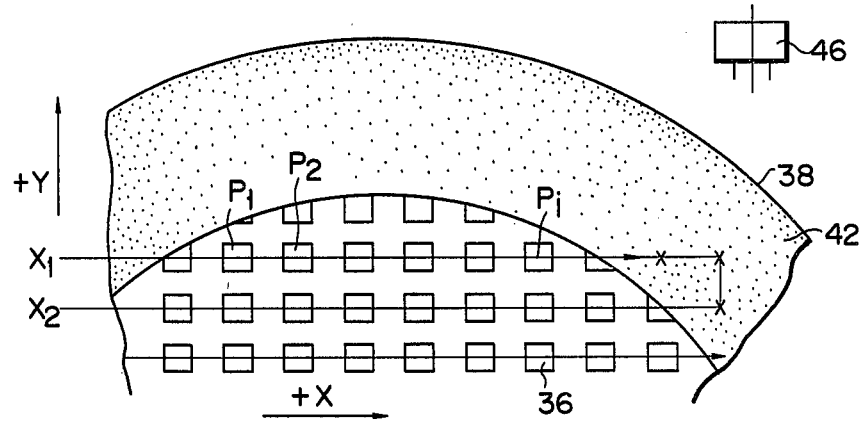
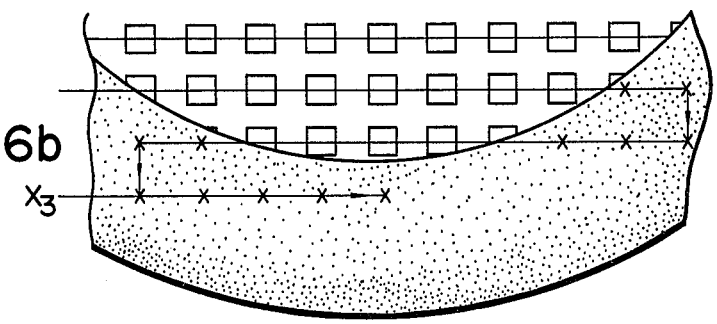

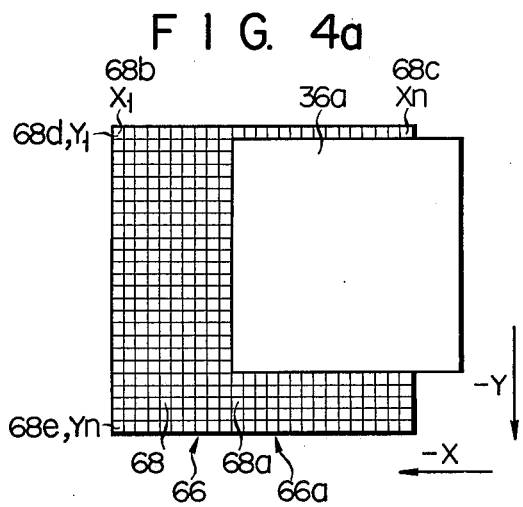
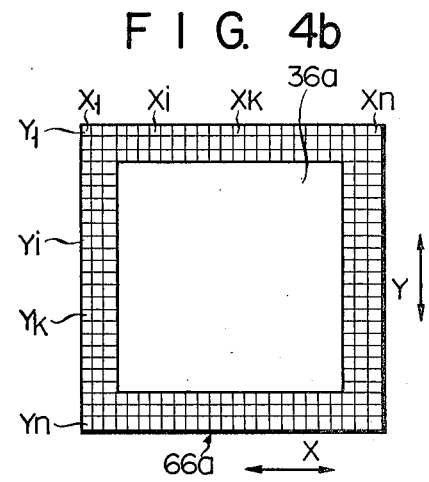
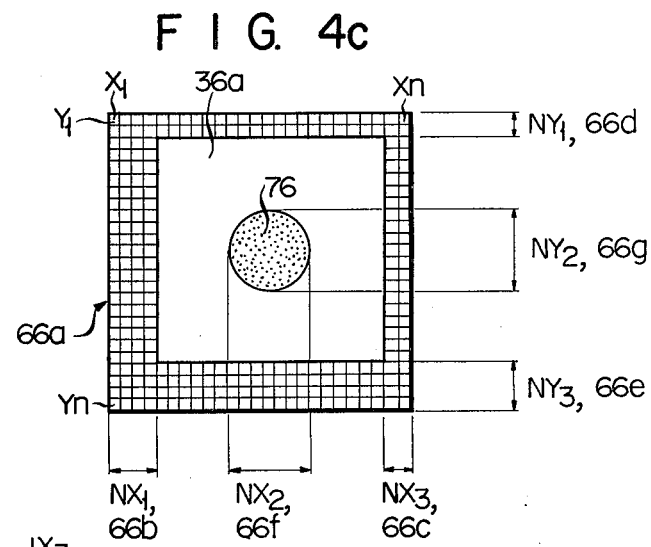
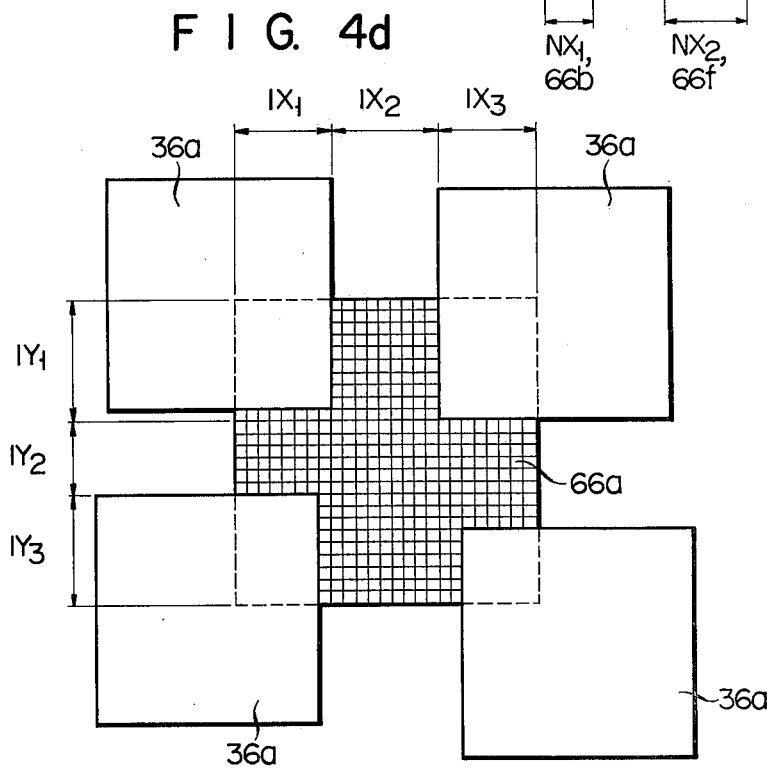

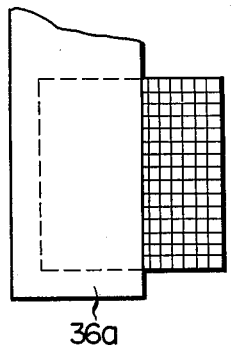
FIG. 4e
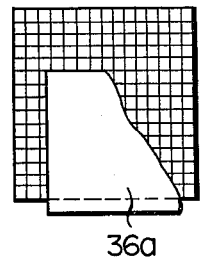
FIG. 4f
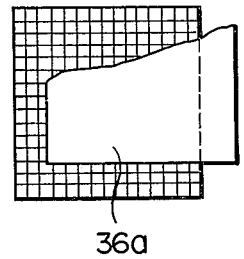
FIG. 4g
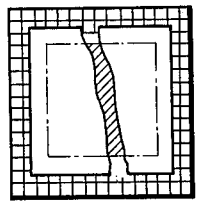
FIG. 4h
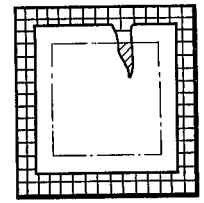
FIG. 4i
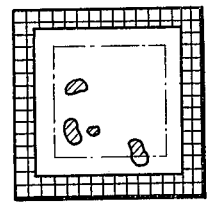
FIG. 4j
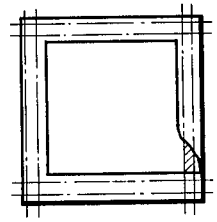
FIG. 4k
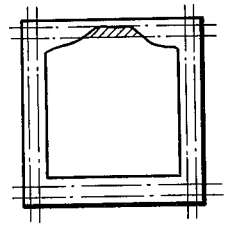
FIG. 4ℓ

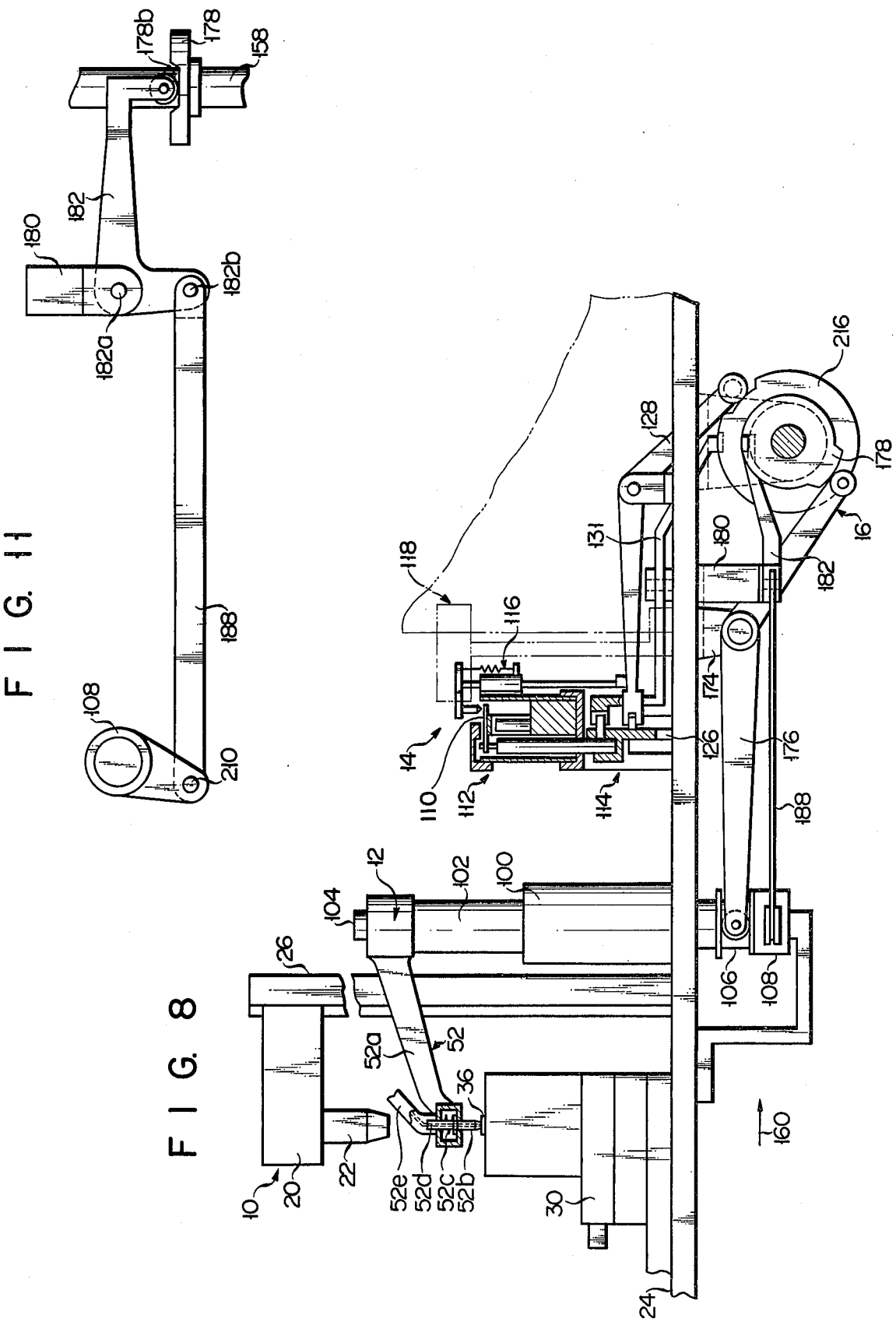

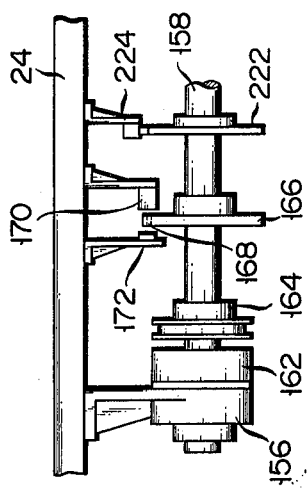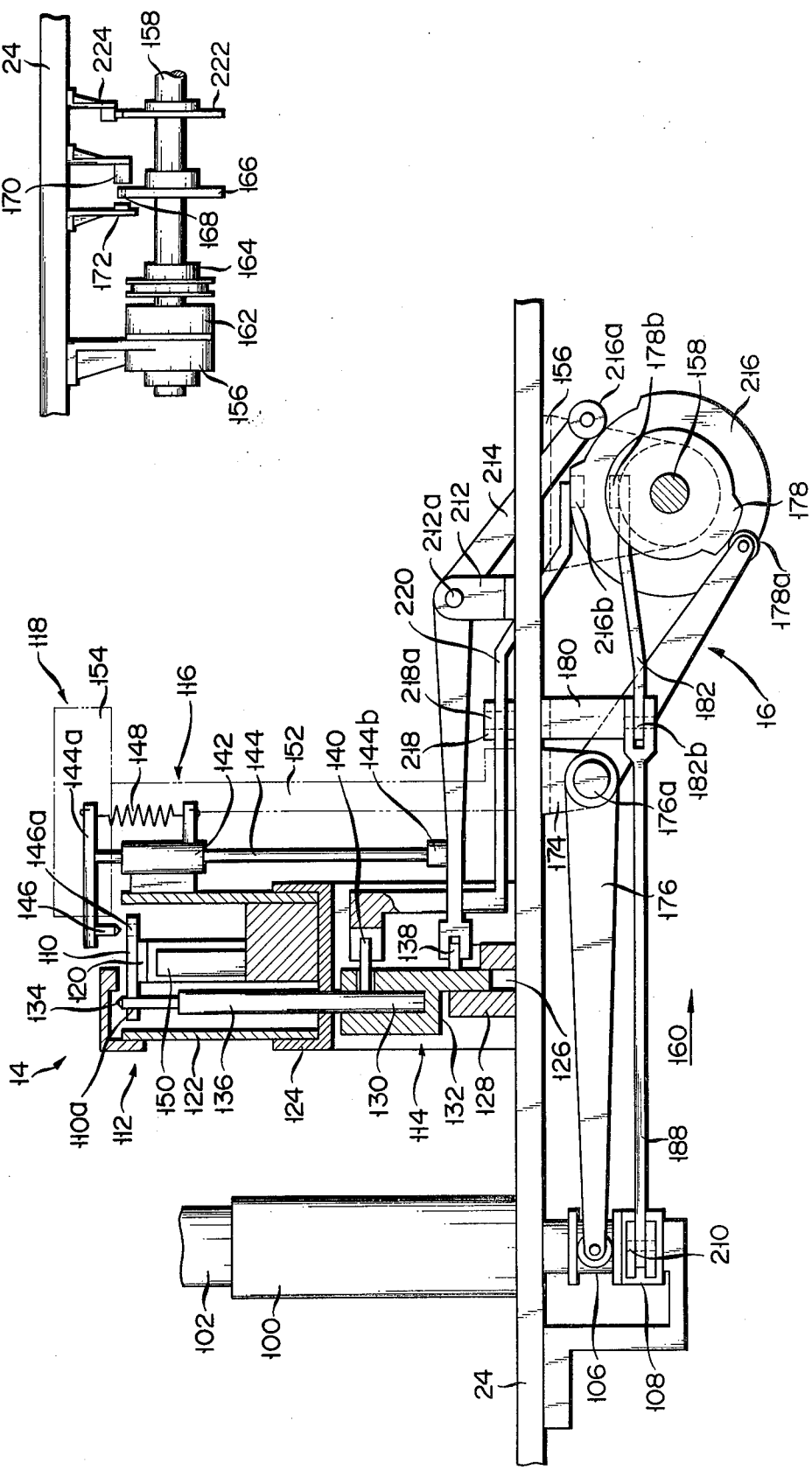

METHOD OF POSITIONING A SEMICONDUCTOR MEMBER BY EXAMINING IT AND A DIE BONDING APPARATUS USING THE SAME

BACKGROUND OF THE INVENTION

This invention is suitable for the performance of a die bonding process in manufacturing a semiconductor member, and relates to a method of positioning, by examining the semiconductor members, each qualified one thereof at a prescribed position and to a die bonding apparatus using the said method.

To precisely perform a die bonding process in manufacturing a semiconductor member, it is generally necessary first to examine such semiconductor members, i.e., pellets, disposed, in orderly arrangement and at appropriate intervals, on a transparent sheet pasted onto a wafer cassette and then to move with precision only each qualified one of the pellets, that is, to position it with precision. By being precisely positioned as such, the pellet is precisely picked up by a pellet picking-up mechanism and is carried to a prescribed position on a lead-frame and thus is secured thereto. Accordingly, the next process, for example, a wire bonding process, can be conducted with precision.

Conventionally such method of examining the qualification or non-qualification of pellets and precisely positioning each of pellets at a prescribed position, as mentioned above, is already contemplated and reduced to practice. There does not exist, however, any easily manipulatable and highly reliable apparatus for sequentially automatically examining with high precision a large number of pellets loaded on a wafer cassette and positioning each pellet at a prescribed position.

A conventional apparatus is outlined as follows. That is, one of the methods used to examine the qualification or non-qualification of pellets and position each qualified one thereof comprises the step of moving, while an operator is microscopically observing a pellet, such pellet to a prescribed position defined within a visual field of the microscope, and visually examining the qualification or non-qualification of the pellet during the pellet moving operation. But this method has the drawback that such examining and positioning operation is very tiresome and yet requires a high level of skill. Thus there has been a demand for other methods, especially for automatization of such an examining and positioning operation.

In accordance with the above-mentioned demand, a wide variety of automatizing methods have heretofore been contemplated. In automatization of the pellet examining and positioning method, a method using a television camera has been proposed as one such examining and positioning method. One of such television camera using method is an invention of Japanese Patent Application Publication No. 1689/73 as filed in Japan, entitled "A method of positioning articles and an apparatus therefor". Generally, the automatization of this type of positioning operation is performed by using the method of converting into a digital signal an image signal photographed by a television camera and processing the digital signal by operation of an electronic computer or an operation processor circuit similar thereto, thereby to calculate the amount of displacement of an article or substance from a normal or correct position therefor. In this case, however, in order to convert said image signal into such digital signal, the sampling of the image signal has to be performed. Since the scanning speed by the camera is remarkably high, a circuit for such sampling also has to have a very high-speed performance. Further, a considerably high level of technique is required to supply the sampled signal data into said computer or operation processor circuit. As a result, the apparatus itself using such method becomes costly, and entry or mixing of noises thereinto becomes likely to occur. This apparatus, however, has various drawbacks including those that the constituent parts of the apparatus are likely to be thermally changed due to heat generation from a television camera to cause an occasional change with time of the light axis; that the television camera is operated in accordance with analogue signals to cause an easy entry or mixing thereinto external noises and also to cause an easy occurrence of a drift phenomenon; that the pellet positioning can not quickly be carried out owing to the existence of residual images on the photoelectric face of an image pickup tube; that since the scanning direction of scanning lines of the television camera is fixed, a complicated circuit is required to obtain signals denoting the position of a two-dimensional article; and that a television camera providing a large number of scanning lines is required to be used for close detection of an article position, resulting in a high cost of such television camera. Therefore, the above apparatus can not be said to sufficiently fit the practical use from the standpoints of positioning precision, operating efficiency, expenditures, etc.

Further, in addition to such apparatus using a television camera as mentioned above, another examining and positioning method has been contemplated which comprises projecting the enlarged image of a pellet on a screen, detecting in analogue manner the edge portions of the enlarged projected image by means of photoelectric conversion elements, such as solar batteries, disposed on the screen, and moving the pellet so as to permit the resulting detection output to become a prescribed value, thereby to perform the positioning of the pellet. However, the side faces of a pellet are often not perpendicular to the upper face thereof, and further at the edge portions of the pellet there usually exist irregularities of a considerably large size and number. Therefore, the pellet positioning can not be performed with high precision. This examining and positioning method has further drawbacks. Even in a case where a pellet has damages or breakages causing no inconveniences on the performance of the pellet, it is judged to be a defective pellet or it fails to be precisely positioned. Since in the die bonding process an analogue signal delivered from each photoelectric conversion element is used, in a case where a light intercepting foreign matter such as dust has been adhered to, for example, a vinyl sheet having pellets pasted thereon, precise edge detection becomes impossible.

As above described, any of the conventional methods encounter difficulties in the positioning of a pellet with high precision, and the examining of pellet qualification, necessary to, for example, the die bonding process in the course of manufacturing a semiconductor element.

SUMMARY OF THE INVENTION

The object of the invention is to provide a method of positioning a semiconductor, by examining it, which comprises sequentially automatically examining semiconductors and positioning each qualified one of them with high precision, and a die bonding apparatus using the said method.

To achieve the above object, the method of the invention, which is performed by focussing the optical image of a semiconductor member on a photoelectric conversion face obtained from arranging photoelectric conversion elements in rows and columns into a matrix form and by scanning for detection the respective distributions of first photoelectric conversion elements each producing an output signal when spotlighted by said optical image and second photoelectric conversion elements each producing no output signal when not spotlighted, comprises the following steps (a) to (f):

(a) the step of setting a left reference column, a right reference column, a top reference row and a bottom reference row, thereby to determine the respective numbers of left and right column groups consisting respectively of columns consecutively arranged toward said optical image from said left and right reference columns, inclusive, and each having said first photoelectric conversion elements of a number not greater than a prescribed numeric value, and the respective row numnbers of top and bottom row groups consisting respectively of rows consecutively arranged toward said optical image from said top and bottom reference rows, inclusive, and each having said first photoelectric conversion elements of a number not greater than a prescribed numeric value;

(b) the step of examining by using respective values of said column number and row number whether or not said optical image of a semiconductor member is present on said photoelectric conversion face; (c) the step of examining whether said optical image of a semiconductor member of said photoelectric conversion face is one or plural;

(d) the step of selecting, in the case where there are a plurality of said optical images of semiconductor members on said photoelectric conversion face, one optical image from those plural optical images;

(e) the step of examining whether the semiconductor member corresponding to the one optical image confirmed to exist during said step (c) or selected during said step (d) is a qualified one or a non-qualified one; and (f) the step of positioning at a prescribed position said qualified semiconductor member confirmed during said step (e).

Further, the die bonding apparatus of the invention comprises a positioning means for examining and positioning a semiconductor member, a picking-up mechanism for picking up the positioned semiconductor member and carrying it onto a lead-frame, and a securing means for securing the carried semiconductor member to the lead-frame, said positioning means including a table for supporting said semiconductor members and being subject to two-dimensional control of the position, an optical system for focussing on a focussing face optical images of said semiconductor members supported on said table by means of light beams reflected from said semiconductor members, a solid image sensor having on said focussing face a photoelectric conversion face consisting of plural photoelectric conversion elements arranged in rows and columns into a matrix form, a detector circuit for detecting an output of each of said photoelectric conversion elements constituting said solid image sensor, an operation processor for subjecting said output of said detector circuit to operation processing to obtain position and examination information of said semiconductor member thereby to send out a position correction signal of said semiconductor member and an examination signal thereof as to whether it is a qualified one or a non-qualified one, a driving means for moving said table two-dimensionally, and an electric circuit having a drive controller circuit for controlling said driving means in accordance with the position and examination information set out from said operation processor.

Further, if the above-mentioned positioning process is additionally provided with an automatic feed step for stepwise moving as a whole the semiconductor members arranged in rows and columns at prescribed intervals thereby to sequentially perform the examining and positioning of each said semiconductor member, the examining and positioning operations can conveniently be performed without assistance by hands. If, in order to perform the said automatic feed step, provision is made of a boundary mark surrounding an arrangement region of said semiconductor members arranged on said table, a boundary sensor for sensing or detecting said boundary mark by means of a light projected by said optical system, and a second drive controller circuit for controlling said driving means so as to cause a stepwise moving of the table rows or columns upon receipt of an output signal from said boundary sensor, and to reverse the moving direction of said table, it will offer a convenience in automatically wastelessly examining and positioning the semiconductor members within said surrounding boundary mark.

According to the method of the invention, the examining and positioning of a semiconductor member can not only automatically be executed in accordance with a previously set program but the following results (a) to (f) can be obtained:

(a) Since information necessary to the examining and positioning of a semiconductor member is synthetically judged in accordance with output signals of the photoelectric conversion elements arranged in the form of a matrix, and amendment or correction to the positioning and examination of the qualification of the semiconductor member are made in accordance with the results of such synthetic judgement, the present method enables a more precise examinating and positioning of the semiconductor members than in accordance with the results of partial judgement.

(b) Since the apparatus using the present method can be so constructed that a reference value, i.e., specified value, used in making such synthetic judgement as mentioned in the above item, (a) may be easily obtained by varying the setting value of a drive controller circuit, the operation contents can be easily changed from one contents to another in accordance with the type of a semiconductor member to be handled, an applicable examination standard, and an applicable quality control standard. Accordingly, an applicable range of the apparatus using the present method becomes very wide.

(c) As compared with the use of a method using a television camera, the use of the present method can remove undesirable effects resulting from thermal drift or drift with time of information values as to a semiconductor member, or undesirable effects due to residual images, or undesirable effects on maintenance resulting from the shortage of a semiconductor member life.

(d) Since the scanning speed for the photoelectric conversion elements arranged into a matrix form can be varied optionally it can be so adjusted as to achieve its matching with the data entry speed of an electronic computer, or with the operating speed of an operation processor circuit, connected to the next stage. Accordingly, if output signals from the photoelectric conversion elements are only once scanned and detected, these output signals are subject to operation processing to obtain in a short time those information values of a semiconductor member. Therefore, the operation efficiency is increased, and an interface circuit and said operation processor circuit involved in said electronic computer can be readily designed to become inexpensive. Further, if small-sized photoelectric conversion elements are used, the resulting output information has a high resolution. In any case, therefore, the use of the present method provides more merits than the use of the television camera using method.

(e) By properly selectively determining the reference value or specified value mentioned in the above item (b), the present method permits a positioning error which, when the semiconductor member is put to practical use, does not constitute an obstruction, and also permits defects of a semiconductor member such as outer-dimensions defects, cracks, damages, stains or partial oversized, which, when the semiconductor member is put to practical use, does not become an obstruction. It is impossible, therefore, that even a usable member is judged to be a non-qualified or defective one.

(f) Further, according to the present method, output information of the photoelectric conversion elements is subject to arithmetic operation processing and as a result of such operation processing the table having a semiconductor members loaded thereon can be moved automatically. Besides, by the use of the boundary mark surrounding the photoelectric conversion elements and the boundary sensor for detecting the boundary mark, all of the photoelectric conversion elements disposed inside the boundary mark can be examined and positioned wastelessly.

BRIEF DESCRIPTION OF THE DRAWING

FIG. 3 is a view for explaining an optical system of the apparatus of FIG. 1;

FIGS. 4a to 4l are views for explaining the operation of the apparatus of FIG. 1;

FIGS. 6a and 6b are views for explaining the operation of the FIG. 1 apparatus, wherein boundary marks are used;

FIG. 8 is a side view showing the mutual relations between the positioning means, a picking-up mechanism, the securing means and driving mechanism of the FIG. 1 apparatus;

FIG. 9 is a side view for explaining the structures and operations of the means and mechanisms shown in FIG. 8;

FIG. 10 is a side view showing a cam shaft of the driving mechanism of FIG. 8 and a part of its associated section; and FIG. 11 is a plan view of a mechanism for rocking a picking-up tool of FIG. 9, showing only a main portion thereof with a base board thereof omitted.

DETAILED DESCRIPTION OF THE PREFERRED EMBODIMENT

Figure 1:
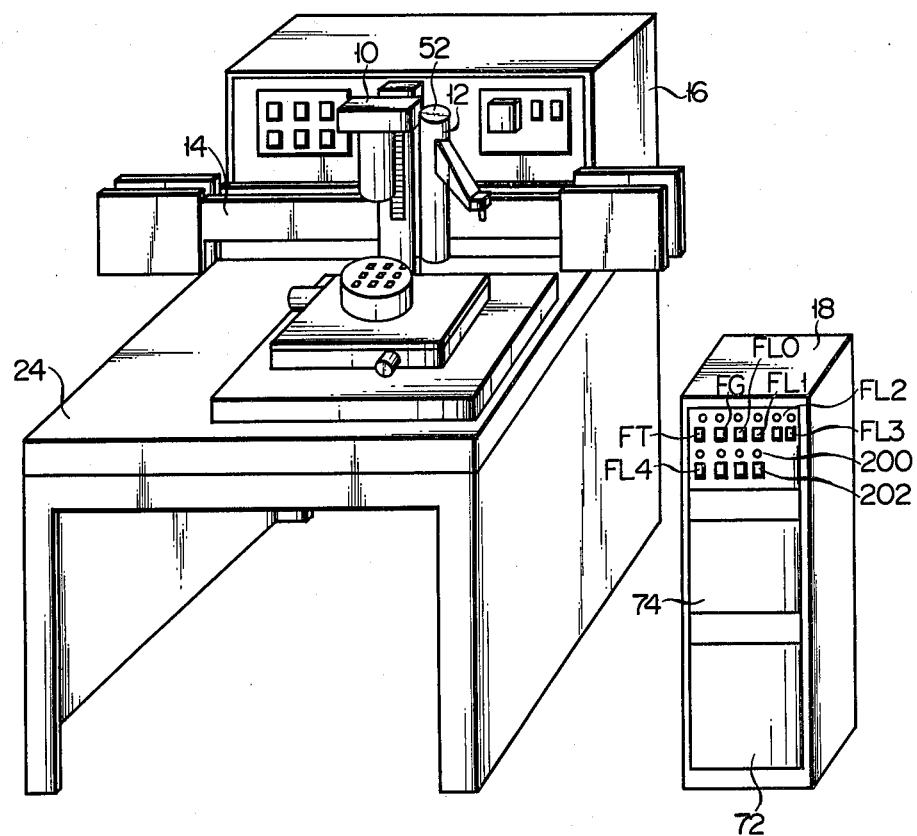
FIG. 1 is a perspective view showing the schematic construction of a die bonding apparatus according to an embodiment of the invention.

FIG. 1 is a perspective view showing the schematic construction of a die bonding apparatus using the present method of positioning a semiconductor member by examining it. Referring to FIG. 1, a numeral 10 denotes a positioning means for examining and positioning a semiconductor material member (hereinafter referred to as a pellet), 12 a picking-up mechanism for conveying an examining and positioning pellet to a bonding position, 14 a securing means supporting a lead-frame at the bonding position to secure the pellet to the lead-frame, 16 a driving mechanism for driving the said securing means and picking-up mechanism in turn, and 18 an indicating means designed to count a total number of processed pellets, the number of non-qualified pellets, etc. to indicate these numbers.

Hereinafter, the above-mentioned means and mechanisms will be explained in detail.

Figure 2:
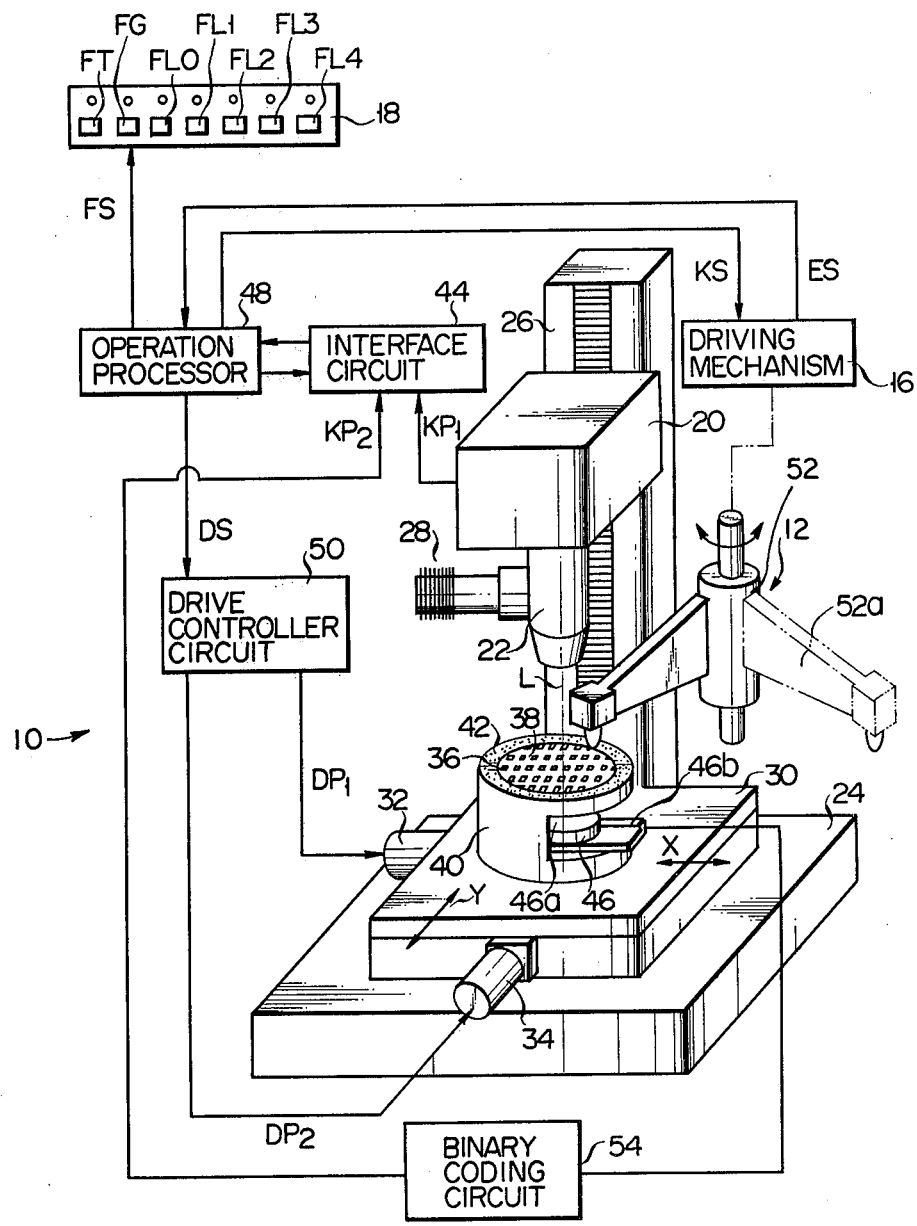
FIG. 2 is a perspective view showing a positioning means and securing means of FIG. 1 and respective operational systems thereof.

FIG. 2 is a schematic view showing principally the positioning means 10. In FIG. 2, a detector 20 includes therein, for example, photoelectric conversion elements and is equipped with an optical detection mechanism 22 at its lower end portion and is so fitted as to move vertically to a support column 26 erected on a base plate 24.

The optical detection mechanism 22 operates by the action of a light from a light source 28. On the base plate 24 is provided an XY table 30, which makes a linear reciprocating movement in an X axis direction of FIG. 2 by operation of an X axis pulse motor installed on the base plate 24 and also in a Y axis direction of FIG. 2 by operation of a Y axis pulse motor installed on the base plate 24. On the XY table 30 is mounted a wafer cassette 40 which has applied thereon a transparent sheet 38 having a plurality of pellets 36 loaded thereon at prescribed intervals. The peripheral portion of the sheet is affixed with boundary mark 42 for determining the distribution of the pellets 36, said mark being of a light intercepting material such as paper, magic ink or the like. An interface circuit 44, upon receipt of detection pulses or detection signals $KP_1$, $KP_2$ from the detector 20 and a boundary sensor 46 as later described, sends out an output signal to an operation processor 48. The operation processor 48 subjects to operation processing the output signal sent from the interface circuit, thereby calculating the information, qualification or defectiveness information, boundary information, search information of the pellet 36 which are used for the next pellet, etc. Thus, the operation processor 48 supplies a drive signal DS based on such information to a drive controller circuit 50, an indication signal FS based on such information to an indicating means 18, and a picking up tool drive signal KS based on such information to a driving mechanism 16. The operation processor 48 is formed of a minicomputer, a microcomputer, or the like.

The drive controller circuit 50, upon receipt of the drive signal DS formed based on previously programmed instruction information, position correction information, etc., sends a drive pulse $DP_1$ for normal rotation and a $DP_2$ pulse for reverse rotation to the X axis pulse motor 32 for the X axial driving of the tble 30 and the Y axis pulse motor 34 for the Y axial driving of the table 30, respectively. The indicating means 18 is comprised of a cumulative calculation counter, indication lamp, etc., and subjects to cumulative calculation a total number FT, a qualified item number FG, and a defective or non-qualified item number for each defect type, of the processed pellets 36, said defective or non-qualified item number categorically including, for example, that ($FL_0$) of the pellet items are affixed with defect-indicating marks, that ($FL_1$) of the pellet items are non-qualified in terms of outer dimension, that ($FL_3$) of the pellet items are damaged, cracked or stained, that ($FL_4$) of the pellet items are partially oversized, and that ($FL_2$) of the pellet items are incapable of position correction. Thus, the indicating means 18 makes a timely indication by lamps, and indicates respective total values of such numbers and also indicates them by means of lamps. The driving mechanism 16 is designed to drive a picking-up tool 52 of the picking-up mechanism 12 for picking-up the pellet 36 onto a lead-frame (not shown). The boundary sensor 46 is constructed such that a photodiode 46a for detecting the boundary mark 42 by means of a light is fitted to a support piece 46b mounted on the base plate 24. The detection output obtained from the photodiode 46a is converted into a binary coded signal for detection signals $KP_2$ through a binary coding circuit 54 and is sent into the interface circuit 44.

FIG. 3 shows an optical system of the apparatus shown in FIG. 2. A numeral 56 denotes a lamp used as the light source 28. The light beams emitted from the lamp 56, after rendered substantially parallel by means of a convex lens 58, are reflected by a semi-transparent mirror 60 to be made parallel to a light axis L. These beams of light parallel to the light axis L are irradiated onto the pellet 36 on the light axis L through a pair of objective lenses 62a and 62b. An image of the pellet 36 thus irradiated is focussed on a focussing face S by means of an optical element comprised of the objective lenses 62a, 62b, semi-transparent mirror 60 and a focussing lens 64. On the focussing plane S is disposed a solid image sensor 66, which has a plurality of minute or very small-sized photoelectric conversion elements 68 (FIG. 4a) arranged thereon in the form of a matrix having n rows and n columns. The photoelectric conversion face 66a thus formed, as shown in FIG. 4a, consists of photoelectric conversion face portions 68a of the photoelectric conversion elements 68 arranged in n columns $X_1$-$X_n$ and n rows $Y_1$-$Y_n$. The $X_1$ column is now defined as a left reference column 68b, the $X_n$ column as a right reference column 68c, the $Y_1$ row as a top reference row 68d, and the $Y_n$ row as a bottom reference row 68e. The output condition of the solid image sensor 66 is scanned in turn by a scanning signal SP from a detector circuit 70. This detector circuit 70 produces a scanning pulse or scanning signal SP by operation of, for example, ring counters, shift registers, etc. involved therein and sends it in turn into the solid image sensor 66 and, upon receipt of a response pulse OP from the sensor 66, sends this pulse into the interface circuit 44 as a binary-coded detection output $KP_1$. On the other hand, the light beams having irradiated the pellet 36 are transmitted through the transparent sheet 38 to enter the boundary sensor 46 provided on the light axis L. Accordingly, by providing the boundary mark 42 defining or confining a group of plural pellets 36, the light beam entering the boundary sensor 46 is wholly intercepted when the boundary mark 42 is moved to a position of light axis L. As to the above-mentioned apparatus, the detector 20 is provided in the detector circuit 70 and the interface circuit 44, operation processor 48, drive controller circuit 50 and other electric accessories are received within an operating unit 72, which further includes an operating panel 74 for setting numeric values necessary to the operation of the die bonding apparatus, such as a numeric value necessary to judge the qualification or defectiveness of the pellet 36, numeric values denoting the feeding direction and amount of shifting the pellet 36 as taken along the column and row thereof, etc., and also includes the indicating means 18.

The operation of the positioning means 10 having the foregoing construction will now be described. Referring to FIG. 2, first, the wafer cassette 40 having a plurality of said pellets 36 pasted thereon in columns and rows is mounted upon the XY table 30, which is first so manually moved that the pellet 36 to be detected may be located substantially right on the light axis L, and then is so adjusted that the column and row directions of the pellets pasted in such orderly arrangement may be rendered substantially parallel to the above-mentioned X and Y directions of the XY table 30. Further, the positioning means 10 is so constructed that the moving directions of the XY table 30 may coincide with the left and right reference columns, and the top and bottom rows, of the solid image sensor 66 disposed on the said focussing face S. Next, the operating panel 74 (FIG. 1) is adjusted to designate or instruct the amount, and the direction, i.e., leftward or rightward direction, of stepwise feeding or shifting the XY table 30 in the X direction and similarly to instruct the amount, and the direction, i.e., advancing or retreating direction of FIG. 2, of stepwise feeding or shifting the XY table 30 in the Y direction. The said X and Y directional steps are defined to mean pitches between each of two adjacent pellets disposed in arrangement in the X and Y directions, respectively.

Figure 5:
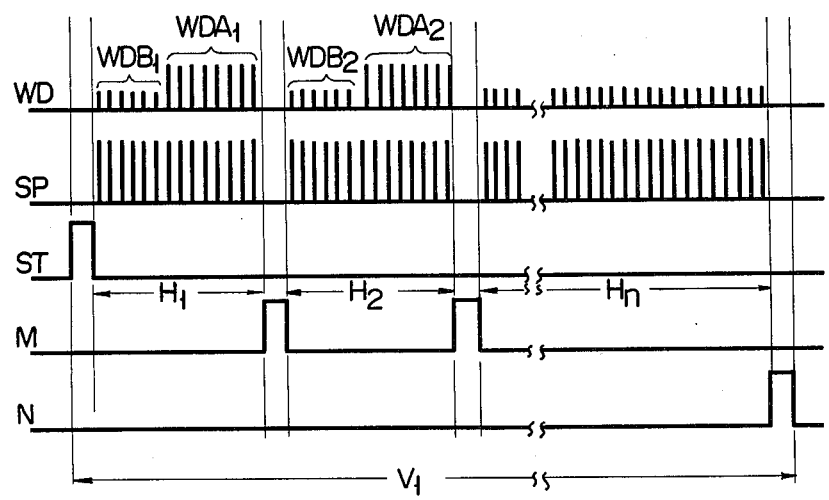
FIG. 5 is a time chart for explaining the operation of the apparatus of FIG. 1.

Thus, the preliminary operation is completed and in subsequence a continuous automatic operation of the apparatus (hereinafter referred to "a main operation") is started. That is, when the above-mentioned preliminary operation has been completed, a start button (not shown) is pushed which is provided on the operating panel 74. Then, as shown in FIG. 2, the pellet 36 situated on the light axis L is spotlighted by a light from the light source 28 and an optical image thereof is focussed on the focussing face S by the action of the objective lenses 62a, 62b, semi-transparent mirror 60, and the focussing lens 64. At this time, at least a part of the said optical image 36a, as shown in FIG. 4a, is focussed on the photoelectric conversion face 66a of the solid image sensor 66 by the foregoing preliminary operation. At a point of time prior to the performance of the main operation, however, the center position of the optical image 36a is usually displaced from that of the photoelectric conversion face 66a as shown in FIG. 4a. The "main operation" of the positioning means 10 referred to in this specification is defined to mean an operation of performing the position adjustment, through moving the pellet 36 displaced as such in center position to permit the center of the optical image 36a to coincide with that of the photoelectric conversion face 66a and also to permit mutually corresponding ones of the respective four peripheral sides of both the optical image 36a and the photoelectric conversion face 66a to become substantially parallel to each other, and of performing the examination or the detection of the qualification or defectiveness of the pellet 36. When the above-mentioned preliminary operation has been completed, a scanning signal SP is sent out from the detector circuit 70 and is supplied in turn to the input terminal of each photoelectric conversion element 68 of the solid image sensor 66 one for each element 68 thereof. For example, in FIG. 4a, with respect to the uppermost row $Y_1$, or top reference row 68d, of the photoelectric conversion face 66a of the solid image sensor 66, the scanning signal SP is supplied to each row element in turn from left to right. Similarly, with respect to the second uppermost row $Y_2$, the scanning signal SP is supplied to each row element in turn from left to right. Similarly, with respect to each of the rest, the scanning signal SP is supplied to each row element in turn from left to right up to the lowermost row $Y_n$, or bottom reference row 68e. As a result of the foregoing scanning operation, a detection output WD shown in FIG. 5 is produced at the output terminal of each photoelectric conversion element 68.

The detection output WD consists of two types of signals, one of which is a signal consisting of $WDA_1$ and $WDA_2$ (which are referred to as "WDA" when collectively done) and the other of which is a signal consisting of $WDB_1$ and $WDB_2$ (which are referred to as "WDB" when collectively done). The WDA signal denotes the output of the photoelectric conversion element 68 or elements falling under a region of each row of the photoelectric conversion face 66a where the optical image 36a of the pellet is formed, while the WDB signal denotes the output of the photoelectric conversion element 68 or elements falling under a region of each row of the photoelectric conversion face 66a where the optical image 36a of the pellet is not formed. The former output or WDA is used as a signal having a binary code "1", while the latter output or WDB is converted into a signal having a binary code of "0". In FIG. 5, ST represents a scanning start signal, M a scanning completion signal for each row, and N a scanning completion signal for all rows of the photoelectric conversion face. $V_1$ represents a period of time required from a time point for the production of the scanning start signal ST to a time point for the production of scanning completion signal N, while $H_1, H_2 \ldots H_n$ represent a scanning period of time for each row, respectively.

The above-mentioned detection output WD is sent as a response pulse OP to the detector circuit 70 and is further sent to the operation processor 48 through the interface circuit 44 and is stored in the operation processor 48. When the processor 48 is supplied with the initial scanning completion signal N it counts the number of "1" signals included in each of the rows $Y_1-Y_n$, that is, the respective numbers of $WDA_1$ signals, $WDA_2$ signals ... of FIG. 5, thereby to determine the row of which such counted value is not greater than a specified value $DC_{10}$ (hereinafter referred to as a no-output row).

Next, the operation processor 48 calculates the number $NY_1$ of the row $Y_1$ (the top reference row 68d) and the succeeding rows, which collectively form a group 66d (hereinafter referred to as an "upper row group", see FIG. 4c), and of a respective one of which said counted number of "1" signals is not greater than the specified value $DC_{10}$, and also calculates the number $NY_3$ of the row $Y_n$ (the bottom reference row 68e) and the succeeding rows, which collectively form a group 66e (hereinafter referred to as a "lower row group"), and of a respective one of which said counted number of "1" signals is not greater than the specified value $DC_{10}$, and further calculates the number $NY_2$ of rows of the remaining row group, of a respective one of which said counted value number of "1" signals is not greater than a specified value $DC_{11}$.

In accordance with the same detection output signals as used in the above operation, the operation processor 48 counts the number of "1" signals included in each of the columns $X_1-X_n$. As in the above operation, the operation processor 48 calculates the number $NX_1$ of the column $X_1$ (the left reference column 68b) and the succeeding columns, which collectively form a group 66b, and of a respective one of which said counted number of "1" signals is not greater than the specified value $DC_{10}$, that is, the number of columns of the no-output column group (hereinafter referred to as a "left column group"), and also calculates the number $NX_3$ of the column $X_n$ (the right reference column 68c) and the succeeding columns, which collectively form a group 66c, and of a respective one of which said counted value number of "1" signals is not greater than the specified value $DC_{10}$, that is, the number of columns of the no-output column group (hereinafter referred to as a "right column group"), and further calculates the number $NX_2$ of columns of the remaining column group, of a respective one of which said counted number of "1" signals is not greater than the specified value $DC_{11}$.

Next, such examinations as described below are performed using the numeric values of the above-mentioned $NY_1$, $NY_2$, $NY_3$, $NX_1$, $NX_2$ and $NX_3$.

The first examination; this is an examination for judging whether or not any optical image 36a is present on the photoelectric conversion face 66a.

Upon this judgement, a specified value $DC_{13}$ is previously set in the operating panel 74. In a case where:

$$NY_1+NY_3>DC_{13},$$

or $$NX_1+NX_3>DC_{13},$$

it is judged that there exists no pellet 36 on the photoelectric conversion face 66a, and in accordance with the instruction previously set in the operating panel 74 (FIG. 1) the next pellet 36 is to be fed by one pitch so that the optical image 36a thereof may be located on the photoelectric conversion face 66a.

FIGS. 4e, 4f and 4g illustrate cases where the above two inequalities hold true, that is, cases where the configuration of the pellet is non-qualified. In the case of FIG. 4e, a longitudinally elongated pellet with its optical image 36a as shown is projected over the entire left side portion of the photoelectric conversion face. As a result, $NY_1+NY_3$ becomes greater than $DC_{13}$. In the case of FIG. 4f, a pellet with its optical image 36a as shown is obliquely deficient in shape, so that $NX_3$ becomes great and $NX_1+NX_3$ becomes greater than $D_{13}$, even when the value of $NX_1$ is small. In the case of FIG. 4g, the upper portion of the pellet is obliquely deficient in shape as shown by the projected optical image 36a. Consequently, the value of $NY_1$ becomes great even when the value of $NY_3$ is small, with a result that $NY_1+NY_3$ becomes greater than $D_{13}$. In a case where the above condition is not established, the pellet 36 is judged to exist within the above-mentioned visual field of the photoelectric conversion face 66a, and is counted by the indicating means 18 (FIG. 2) and indicated by means of the lamp, and this counted value is indicated at the processed total pellet number counter section FT thereof.

The second examination; this is an examination for judging whether or not a plurality of optical pellet images 36a are present within the visual field of the photoelectric conversion face 66a. In this examination, in a case where, with respect to both the row $Y_1$ (the top reference row 68d) and the row $Y_n$ (the bottom reference row 68e), the number of "1" signals produced is not zero, or where, with respect to both the column $X_1$ (the left reference column 68b) and the column $X_n$ (the right reference column 68c), the number of "1" signals produced is not zero, it is judged that a plurality of pellets 36 exist within the said visual field, and one 36a of such pellets images which most largely overlaps on the photoelectric conversion face 66a is moved toward the center of the photoelectric conversion face 66a. For example, in case of FIG. 4d, the number of "1" signals included in each of the rows $Y_1$-$Y_n$ is counted thereby to detect a row or rows of which such counted value is 1 or more than 1. The operation processor 48 thereby calculates the number $IY_1$ of the row $Y_1$ (the top reference row 68d) and the succeeding rows, which collectively form a group, and a respective one of which has "1" signals, and also the number $IY_3$ of the row $Y_n$ (the bottom reference row 68e) and the succeeding rows, which collectively form a group, and a respective one of which has "1" signals, and further the number $IY_2$ of rows of the remaining row group. In accordance with the same detection output signals as in the foregoing operation, the operation processor 48 counts the number of "1" signals included in each of the columns $X_1$-$X_n$ and similarly calculates the number $IX_1$ of the column $X_1$ (the left reference column 68b) and the succeeding columns which collectively form a group, a respective one of which has "1" signals, and also the number $IX_3$ of the column $X_n$ (the right reference column 68c) and the succeeding columns which collectively form a group, and a respective one of which has "1" signals, and further the number $IX_2$ of columns of the remaining column group. Next, comparison is made between the above calculated values $IY_1$, $IY_3$, $IX_1$ and $IX_3$, and as a result in a case where:

$$IY_1 > IY_3$$
and
$$IX_1 < IX_3$$

as shown in, for example, FIG. 4d, a position-correcting drive signal DS (FIG. 2) for moving the optical image 36a by the amounts of $(IY_2+IY_3)-DC_6$ and $(IX_1+IX_2)-DC_6$ in the X and Y directions, respectively, is delivered from the operation processor 48 in accordance with the above calculated values other than the greater values $IY_1$ and $IX_3$. The above $DC_6$ is a value determined on the basis of the respective sizes of the photoelectric conversion face 66a and the pellet 36, that is to say, represents a value equal to ½ of the number of the rows and columns of photoelectric conversion elements 68 which, in a case where the optical image 36a of an average-sized pellet is precisely positioned on the photoelectric conversion face 66a, that is, normally positioned thereon, are not overlapped on that optical image 36a. When the drive signal DS is supplied to the drive controller circuit 50, from this circuit the drive pulses $DP_2$ and $DP_1$ are delivered or generated to cause a rotation of the Y axis pulse motor 34 and X axis pulse motor 32, thus to cause a moving of the XY table 30 in the Y and X directions shown in FIG. 2, respectively. As a result, the optical image 36a of the pellet 36, as shown by arrows in FIG. 4a, is moved in $-Y$ and $-X$ directions, respectively, up to a position shown in FIG. 4b. At this time, the pellet 36 is positioned precisely. If the relationships between $IY_1$, $IY_3$, $IX_1$ and $IX_3$ are such that $$IY_1 < IY_3$$
and
$$IX_1 > IX_3$$

the XY table 30 is so actuated that the optical image 36a may be moved by the amounts of $(IY_1+IY_2)-DC_6$ and $(IX_2+IX_3)-DC_6$ in the Y and X directions, respectively, on the basis of the calculated values other than the greater values $IY_3$ and $IX_1$.

In the above-mentioned way, one optical pellet image 36a, accordingly one pellet 36, is selected. Thereafter, the above selected photoelectric conversion elements 68 is scanned, whereby the $NY_1$, $NY_2$, $NY_3$, $NX_2$ and $NX_3$ are calculated. During this calculating process, in a case where concerning both the row $Y_1$ (the top reference row 68d) and the row $Y_n$ (the bottom reference row 68e) the number of "1" signals produced is zero, or in a case where concerning both the column $X_1$ (the left reference column 68b) and the column $X_n$ (the right reference column 68c) the number of "1" signals produced is zero, it is confirmed that one optical pellet image 36a is focussed within the visual field of the solid image sensor 66. Therefore, the following examination is carried out by the use of the values of the above $NY_1$, $NY_2$, $NY_3$, $NX_1$, $NX_2$ and $NX_3$.

In the die bonding apparatus according to this embodiment, the pellet fed to the positioning means has its electric characteristics previously measured during the preceding inspection process step and, where judged to be non-qualified, is previously affixed with a defect-indicating mark 76 as shown in FIG. 4c. Since this mark 76 is focussed, as an optical image, on the focussing face S together with the pellet, this portion of defect-indicating mark 76 can be detected as a portion of "0" signal. Accordingly, when the values of the said $NY_2$ and $NX_2$ have exceeded the prescribed value $DC_1$, the pellet is judged within the operation processor 48 to be in a state affixed with such mark 76, which leads to the examination conclusion that this pellet is a defective one. In this case, the pellet 36 is not required to be positioned precisely, and the output information of the pellet 36 from the operation processor 48 is counted in the indicating means 18 (FIGS. 1 and 2) and indicated by means of the lamp, and the resulting total number of such pellets is indicated at the defect-indicating mark display section $FL_0$. Simultaneously, the XY table 30 is moved by one pitch of pellet 36 in accordance with the numeric value already set in the operating unit 72 by the operator. Thus, the examining and positioning operation as to the next pellet 36 starts to be performed.

In the case where, during the foregoing qualification examination, no such defect-indicating mark 76 has been detected, examination of the contour or outer dimension of the pellet 36 is conducted. That is, if, in case of using the values of the said $NY_1$, $NY_3$, $NX_1$ and $NX_3$, both of the formulas or conditions:

$$DC_2 \leqq NY_1 + NY_3 \leqq DC_3$$
and $$DC_2 \leq NX_1 + NX_3 \leq DC_3$$

are established, the pellet 36 is judged to be qualified, and unless both of said conditions are established, is judged to be a defective one. The above $DC_2$ and $DC_3$ are values previously determined in accordance with a specified reference. When the pellet 36 has been judged to be defective or non-qualified, the output information of the pellet 36 from the operation processor 48 is counted in the indicating means 18 and indicated by means of the lamp, and the resulting total number of such pellets is also indicated at the outer-dimension non-qualification display section $FL_1$. Simultaneously, the XY table 30 is moved by one pitch of pellet 36. Thus, the examining and positioning operation as to the next pellet 36 starts to be conducted. Conversely, when the pellet 36 has been judged to be qualified in terms of outer dimension, it will next be subject to examination of the position.

The position examination is directed to judging whether or not the pellet 36 having passed the outer-dimension examination is located in a normal or prescribed position. If the following four conditions are all satisfied, the pellet 36 is judged to be situated in such normal position.

$$DC_4 \leq NY_1 \leq DC_5$$

$$DC_4 \leq NY_3 \leq DC_5$$

$$DC_4 \leq NX_1 \leq DC_5$$

$$DC_4 \leq NX_3 \leq DC_5$$

The above $DC_4$ and $DC_5$ are values previously determined in accordance with a specified reference. When the pellet 36 has been judged to be located in said normal position, it will next be subject to examination as to whether or not it is cracked, or is damaged, or is stained, as later described. Conversely, when the pellet 36 has been judged to be non-qualified in terms of the position, the XY table 30 is so controlled as to move by a length of $(NY_3-NY_1)/2$ and $(NX_3-NX_1)/2$ in the Y and X directions, respectively. Then, a frequency of 1 is added to a position correction frequency counter provided in the operation processor 48, and again respective values of the said $NY_1$, $NY_2$, $NY_3$, $NX_1$, $NX_2$ and $NX_3$ are calculated, thereby to perform the foregoing examination of position. Note here that the purpose of adding the frequency of 1 to the counter of the operation processor 48 is to judge, when the frequency of position corrections has become equal to or greater than the specified value $DC_{12}$, that the position correction is impossible. When such judgement is made, the pellet 36 judged as such is counted in the indicating means 18 and is indicated by means of the lamp and the resulting total number of such pellets is also indicated at the position correction failure display section $FL_2$. Thus, the examining and positioning operation of the next pellet 36 starts to be conducted.

Where, as in the case where the pellet 36 is judged to be in a state affixed with the defect-indicating mark 76 or to be incapable of position correction, and the next pellet 36 starts to undergo the examining and positioning operation with such immediately preceeding non-qualified pellet 36 not positioned in a normal position, the amount of displacement of the actual position from the normal position of such immediately preceeding non-qualified pellet 36 is calculated in accordance with the respective values of the said $NX_1$, $NX_3$, $NY_1$ and $NY_3$. And the amount of displacement thus calculated is added to a specified amount of pellet feed or shift, and the next pellet 36 is fed by the resulting amount of pellet feed. Thus, said next pellet 36 can be moved to a position closer to the normal position.

Where the pellet 36 has been judged to be located in the normal position, it will next be subject to examination of crack, damage and stain as shown in FIGS. 4h, 4i and 4j. In this examination the number of "0" signals, which exist within the region defined by adding 2 to each of the respective values of the said $NY_1$, $NY_3$, $NX_1$ and $NX_3$, that is, the region of the optical image 36a which is indicated by a one-dot chain line in FIGS. 4h, 4i and 4j, is counted. If this counted value is not greater than a specified value $DC_7$, the pellet 36 is judged to be qualified and undergoes the next examination of partial excess in size. If the pellet 36 is judged to be non-qualified, it is counted in the indicating means 18 and is indicated by means of the lamp thereof and simultaneously the resulting total number of such pellets is also indicated at the crack, damage and stain examination failure display section $FL_3$ of the indicating means 18. Thus, the examining and positioning operation of the next pellet 36 starts to be performed.

In the partial size excess examination, as shown in FIGS. 4k and 4l, the number of "1" signals is counted which exist within the region (indicated by a one-dot chain line) defined by an appropriate row and column selected in accordance with a dimensional error permitted for the pellet 36. If a total number of such "1" signals is not greater than a specified value $DC_8$, the pellet 36 is judged to have no portion partially excessive in size. Unless said total number is equal to or smaller than said specified value $DC_8$, the pellet 36 is judged to be non-qualified. In this case, the pellet 36 is counted in the indicating means 18 and is indicated by means of the lamp thereof and simultaneously the resulting total number of such pellets is also indicated at the partial size excess examination failure display section $FL_4$ of the indicating means 18. Thus, the examining and positioning operation of the next pellet 36 starts to be conducted. The pellet 36 judged to have no portion partially excessive in size is a wholly qualified one having passed all of the foregoing examinations. Such a qualified pellet 36 is counted in the indicating means 18 and is indicated by means of the lamp thereof and simultaneously the resulting total number of such pellets is also indicated at the qualified pellet number display section FG.

Then, in order to thermally bond said wholly qualified pellet 36 onto the lead-frame (not shown), the picking-up tool drive signal KS is sent, as shown in FIG. 12, from the operation processor 48 into the driving mechanism 16. The picking-up tool 52 is thus driven to pick up the precisely positioned pellet 36 and convey the same onto the lead-frame. Upon completion of said pellet conveyance, a tool operation completion signal ES is sent out from a sensor (not shown) to enter the operation processor 48. At this time, a one-pitch movement of the XY table 30 for performing the examining and positioning operation for the next pellet 36 is started in accordance with a specified value previously set in the operating unit 72 by the operator.

Next, explanation will be made of the boundary mark 42 and boundary sensor 46 designed to automatically move the XY table 30 to perform the examining and positioning of each of the pellets 36 arranged on the transparent sheet 38 provided on the wafer cassette 40. In this embodiment, for example, the pellets 36 are arranged on the transparent sheet 38 at intervals each corresponding to a specified pitch in the X and Y directions, and are each moved in turn to the position of photoelectric conversion face 66a (FIG. 4a) and are each subject in turn to the respective performances of the examining and positioning operations. In FIG. 6a, assume now that the XY table 30 having the pellets 36 loaded thereon is set for movement pitch by pitch in the $-X$ direction, thereby permitting the pellets 36 to be shifted to the position of photoelectric conversion face 66a in the order of pellets $P_1$, $P_2$, ... $P_i$ arranged in a row extending along the line $x_1$ in the $+X$ direction, and also that the XY table 30 is set for movement pitch by pitch in the $+Y$ direction, thereby permitting the pellets 36 serially arranged in the $-Y$ direction to be shifted to the position of photoelectric conversion face 66a in the order of such $-Y$ directional serial pellet arrangement. Then, the pellets 36 are fed pitch by pitch along the line $x_1$ in the order of $P_1$, $P_2$, ... $P_i$ to undergo the respective performances of the examining and positioning operations. When one pellet 36 finishes undergoing all such examining and positioning operations and the pitch feed operation from the one pellet to the next one commences and the boundary mark 42 reaches the light axis L (FIG. 2), the light beams parallel to the light axis L which have therefore been irradiated onto the boundary sensor 46 are interrupted by the boundary mark 42. Accordingly, the boundary sensor 46 generates a detection signal indicating the detection of the boundary mark 42. This detection signal, as shown in FIG. 2, is converted into a binary code by the binary coder circuit 54 and is sent as a detection signal $KP_2$ into the interface circuit 44 to be supplied to the operation processor 48. When the detection signal $KP_2$ is supplied to the processor 48, the XY table 30 (FIG. 2) is moved by one pitch in the $+Y$ direction in accordance with an instruction previously set in the operating panel 74 (FIG. 1). Simultaneously, the moving direction of the XY table 30 having therefore been shifted in the $-X$ direction is inversed and starts to be moved in the $+X$ direction, whereby the pellets 36 arranged in series along the row $x_2$ of FIG. 6a are each subject in turn to the performances of the said examining and positioning operations, picking-up operation, etc. from right toward left. Through repetition of the foregoing operations, a large number of said pellets 36 arranged within the region defined by the boundary mark 42 are each automatically scanned in turn and are all subject to the performance of such operations.

When, in the above-mentioned operation, the boundary sensor 46 detects the boundary mark 42 to permit a stepwise feed of the XY table 30, the boundary mark 42 is occasionally detected a plurality of times. The frequency of such detection becomes higher at the termination of the pellet examining and positioning operation and in the case where the line $x_3$ of FIG. 6b, i.e., a line having no pellet 36, is scanned. Accordingly, in the case where, as a result of counting said detection frequency, this counted value Q is equal to or greater than a specified value $DC_9$, all of the examining and positioning steps for each and every pellet 36 fitted on the transparent sheet 38 are judged to have been completed and the apparatus automatically ceases to operate.

In the above-mentioned embodiment, the boundary sensor 46 is installed on the light axis L beneath the transparent sheet 38, as shown in FIG. 3. The boundary sensor 46, as shown in, for example, FIGS. 7a and 7b, can be disposed in other places. In case of FIG. 7a, below the transparent sheet 38 is provided a mirror 60a in a manner inclined at 45° with respect to the light axis L, and the boundary sensor 46 is disposed in the advancing direction of a light reflected from the said mirror 60a at right angle to the direction of its incidence thereinto. In this case, the boundary sensor 46 can be disposed at an isolated position, for example, at a position outside the operation table. The FIG. 7a disposition of the boundary sensor 46 has merit in that the sensor disposition can be selected relatively freely.

Further, in case of FIG. 7b, below the transparent sheet 38 is provided a mirror 60b in a manner inclined at an appropriate angle with respect thereto. The light projected to the mirror 60b in parallel to the light axis L is reflected upwards from the mirror 60b in a direction defining an angle with the light axis, and is further reflected by semi-transparent mirror 60c provided between objective lenses 62a and 62b. The boundary sensor 46 is disposed in the advancing direction of the light reflected from the semi-transparent mirror 60c. The FIG. 7b disposition of the boundary sensor 46 has merit in that the wafer cassette configuration can be simplified and, in the case of installing the transparent sheet on the wafer cassette, it becomes unnecessary to regulate the directionality of pellet arrangement.

Note that the boundary mark may be formed of non-magnetic material so as to be detected or sensed by means of a magnetic sensor.

Hereinafter, explanation will be made of the picking-up mechanism 12 by reference to FIGS. 8 and 9. The detector 20 is supported by the support column 26 erected on the base plate 24. A bracket 100 is also erected thereon backwardly of the support column 26, namely, rightwardly of FIG. 8. A hollow shaft 102 is supported by the bracket 100 so as to be slidably moved in the vertical direction thereof. Into the hollow shaft 102 is rockably inserted a support shaft 104 throughout the interior thereof. To an upper portion of the support shaft 104 is fixed a picking-up tool 52, which comprises an arm 52a, a picking-up unit 52b fitted to a tip end thereof so as to advance therefrom and retreat thereinto in the axial direction thereof, and a spring 52c urging the picking-up unit 52b downwards. The picking-up unit 52b is formed with a through hole 52d at its center and has its lower end portion formed into a taper configuration so as to adsorb and hold the pellet 36, and has its upper end portion fitted with a rubber-made tube 52c communicating with an appropriate vacuum source (not shown). Further, the hollow shaft 102 is fitted at its lower end with a connector 106 having a flange, while the support shaft 104 is fitted at its lower end with a lever 108. When the connector 106 is vertically moved by the operation of the driving mechanism 16 as later described, the picking-up tool 52 is vertically moved through the hollow shaft 102. Further, when the lever 108 is driven by the operation of the driving mechanism 16, the support shaft 104, accordingly the picking-up tool 52, is rocked. At this time, the pellet 36 is held to the lower end of the picking-up unit 52b by the action of vacuum, and is conveyed toward the securing means 14 by the rocking movement of the picking-up tool 52.

Hereinafter, explanation will be made of the securing means 14.

The means 14, as shown in FIGS. 1, 8, and 9 is installed on the upper face of the base plate 24 at a position back of the picking-up mechanism 12 and comprises a support section 112 for supporting and guiding the lead-frame 110, a conveying section 114 for conveying the lead-frame 110 in turn, a fixing section 116 for fixing the lead-frame 110 to a specified position, and a securing section 118 for securing the pellet 36 to the lead-frame 110.

The support section 112 is substantially U-shaped in section and includes a main body 122 having a support plate 120 along an opening formed at the top portion, and a leg body 124 supporting said main body 122, whereby the lead-frame 110 can be slided along the upper face of the support plate 120.

The conveying section 114 comprises a guide body 128 fixed on the base plate 24 and having a sliding groove 126, a conveyor 132 fitted into the sliding groove 126 so as to be slidable therethrough and having a sliding groove 130 opened upwards which extends in a direction perpendicular to the drawing paper face, and a sliding member 136 fitted into the sliding groove 130 and so supported as to be slidable in a direction perpendicular to the drawing paper face and having its upper portion embedded with a plurality of pins 134 engageable with conveying holes 110a of the lead-frame 110. The conveyor 132 is vertically slided through a pin 138 projected from the conveyor 132, and the sliding member 136 is horizontally moved through a pin 140 projected from the same, both by the operation of the driving mechanism 16 as later described in detail. As the result, the lead-frame is subsequently shifted by a predetermined pitch.

The fixing section 116 comprises a bracket 142 attached to a side face of said main body 122 of the support section 112, a rod 144 allowed to pass through the bracket 142 so as to be movable vertically, a pilot pin 146 fitted to a member 142a fixed to the top portion of the rod 144, and a spring 148 attached between the bracket 142 and the member 142a, whereby when the rod 144 is vertically driven, the pilot pin 146 is simultaneously moved also vertically and inserted into a positioning hole 146a of the lead-frame 110 with an appropriate magnitude of urging force by the spring 148.

The securing section 118 is intended to secure onto the lead-frame 110 the pellet 36 conveyed by the picking-up tool 52. In this embodiment, a bonding method based on the utilization of heat is adopted. The securing section 118 comprises a heat generator 150 installed on the underside of the support plate 120 of the said main body 122, and a electromagnetic vibration applying means 154, fixed to a bracket 152 fitted on the base plate 24 to apply a vibration to the picking-up tool 52, whereby a pellet securing position of the lead-frame is heated by means of the heat generator 150 and a side face of the rocked picking-up tool 52 is brought into abutment on the vibration applying means 154 to apply a vibration to said side face, thereby to permit an easy and reliable fitting of the pellet 36 to a specified position of the lead-frame.

Hereinafter, explanation is made of the driving mechanism 16 by reference to FIGS. 9 and 10. On the rear face of the base plate 24 are fitted a pair of brackets 156 (only one of them is shown), by which a cam shaft 158 is supported rotatably. FIG. 10 is a view of the mechanism 16 shown in FIG. 9, as taken from an arrow 160 indicated direction. Referring to FIG. 10, a brake 162 is fitted to the bracket 156. Provided, adjacent the brake 162, on the cam shaft 158 is a pulley 164 given a rotation force by the operation of a motor (not shown).

On the right side of the pulley 164 is provided a circular plate 166, the peripheral portion of which is bored with a light transmission hole 168. On opposite sides of the circular plate 166 and opposing each other are a light source 170 and a photoresistor 172, whereby only when a light is transmitted through the hole 168 by rotation of the circular plate 166, the photoresistor 172 is operated. In FIGS. 8 and 9, a lever 176 is rockably supported by means of a bracket 174 and is rocked, by the action of a cam 178, about a shaft 176a through a roller 178a fitted to an end of the lever 176, thereby to cause a vertical movement of the hollow shaft 102. Further, to a bracket 180 attached to the underside of the base plate 24 is, as shown in FIG. 11, fitted an L-shaped lever 182 so as to be rockable about a pin 182a, one end of said L-shaped lever 182 abutting through a roller 178b on a side face of the cam 178 which is formed with an appropriate irregularity of concaves and convexes, the other end thereof being rockably connected to one end of a connection piece 188 through a pin 182b, the other end of said connection piece 188 being rockably connected, through a pin 210 provided therefor, to a tip end of the lever 108 fitted to the lower end of the picking-up mechanism 12. When the cam 178 is rotated and the lever 182 is rocked about the pin 182a in a counterclockwise direction of FIG. 11, the connection piece 188 is moved rightwards to cause the support shaft 104 (FIG. 8), accordingly the picking-up mechanism 52, to be rocked through the lever 108 in a counterclockwise direction as viewed from above in FIG. 8. Further, on a bracket 212 fitted to the upper face of the base plate 24 is pivotally supported a lever 214 rockable about a pin 212a, one end of said lever 214 abutting on a cam 216 through a roller 216a, the other end thereof being forked, a pin 138 erected on the conveyor 132 being loosely fitted into said forked portion. When the cam 216 is rotated to cause the lever 214 to be rocked, the conveyor 132 is moved vertically. Further, a lever 220 fitted rockably about a pin 218 is fitted, in an upwardly pointed manner, to a bracket 218 provided on the upper face of the base plate 24, and has one end allowed to abut against a side face of said cam 216 which has an irregularity of concaves and convexes, through a roller 216b, and has the other forked end loosely engaged with a pin 140 erected on the said sliding member 136, whereby when the cam 216 is rotated, the lever 220 is rocked in a clockwise or counterclockwise direction as viewed from above in FIG. 9 to cause the sliding member 136 to be linearly moved through the groove 130 in the direction perpendicular to the drawing paper face. Further, a lower end 144b of said rod 144 is allowed to abut against the lever 214 at a position thereof near to the forked portion thereof, whereby when the lever 214 is rocked about the pin 212a, the pilot pin 146 is caused to move vertically through the rod 144.

A cam 222 shown in FIG. 10 is attached to the cam shaft 158 to drive a microswitch 224 provided on the underside of the base plate 24, thereby to open or close associated electric circuits, said microswitch 224 being so formed as to perform the opening and closing of an electromagnetic valve causing a communication of the picking-up tool 52 with a vacuum source.

Hereinafter, the operations of the picking-up mechanism 12, securing means 14, and the driving mechanism 16 will be explained. When, simultaneously with the completion of the pellet 36 positioning operation, a signal is supplied from the operation processor 48 of the positioning means to the driving mechanism 16, the motor (not shown) is driven to cause the pulley 164 of the cam shaft 158 to rotate through a belt (not shown), thereby to cause the cam shaft 158 to rotate. First, the picking-up tool 52 is rocked, is vertically moved, latches onto the pellet 36, picks it up, conveys it, and puts it on the lead-frame 110. At this time, the tip end of the arm 52a is brought into abutment against the vibration applying means 154, so that this means 154 causes a horizontal vibration to permit the pellet 36 to be easily and reliably pressed and secured onto the lead-frame 110 due to heat generated from the heat generator 150. Upon completion of the foregoing operation, the picking-up tool 52 is rocked to the original position to be ready for the picking-up and conveying operation for the next pellet.

When the pellet 36 has been secured onto the lead-frame 110, the cam shaft 158 is driven to rotate to cause the pilot pin 146 to rise, whereby the pilot pin 146 is drawn off from the lead-frame 110. Simultaneously the pin 134 erected on the sliding member 136 is caused to rise so as to enter the hole 110a provided for the lead-frame 110. Subsequently, the lever 220 is driven to cause the sliding member 136, accordingly said pin 134 to advance, thereby to cause the lead-frame 110 to be moved by one pitch. Subsequently, the pin 134 is lowered to escape or disengage from the hole of the lead-frame 110. Simultaneously, the pilot pin 146 is lowered and inserted into the positioning hole 146a, whereby the lead-frame 110 is held in the resulting position. In this position, the lead-frame 110 is kept in a state wherein the next pellet 36 is securable thereto. When the cam shaft 158 further continues its rotation to cause the circular plate 166 to rotate thereby to cause the hole 168 to reach the position of photoresistor 172, the motor (not shown) is subject to interruption of the power supply thereto. As a result, the rotation of the cam shaft 158 is stopped and at the same time the operation processor 48 is supplied with a signal for instructing the commencement of the next examining and positioning operation.

Hereinafter, the indicating means 18 will be explained. As shown in FIG. 1, the indicating means 18 comprises a series of lamps 200 and indicators 202 fitted on the operating unit 72. Information contents to be displayed are all determined in accordance with instruction signals sent over from the operation processor 48. Indication items includes the total processed pellet number FT, qualified pellet number FG, defect-indicating mark affixed pellet number $FL_0$, outer configuration non-qualified pellet number $FL_1$, position correction failure pellet number $FL_2$, cracked, damaged and stained pellet number $FL_3$, partially excessive sized pellet number $FL_4$, etc., and respective cumulated values of said pellet numbers are displayed.

The preceding descriptions are for respective explanations of the examining and positioning method and the die bonding apparatus of the invention. The specified values $DC_1, DC_2, \ldots DC_{13}$ referred to in the preceding descriptions are determined taking account of a desired precision necessary to dimension or position examination of the pellet, examination standard, quality control standard of the pellet, etc. For example, in the above-mentioned embodiment, the same specified value of $DC_{10}$ is used to calculate the said $NY_1$, $NY_3$, $NX_1$ and $NX_3$. But such specified values may respectively be determined to appropriate values taking further into consideration the case where the adjacent sides of the pellet are different in length, that is, where the row and column lengths of a corresponding photoelectric conversion face portion are not the same, conditions such as those as to a permissible extent of pellet inclination, pellet configuration, photoelectric conversion face construction, etc.

Further, the reference columns and rows referred to in the above-mentioned embodiment are selectively determined at the edge portions of the photoelectric conversion face, but are not limited thereto and may be determined at portions other than such edge portions.

As above described in detail, the method of the invention is performed by focussing the optical image of a semiconductor member onto the photoelectric conversion face having the photoelectric conversion elements arranged into a matrix form and scanning in turn each and every one of such photoelectric conversion elements, thereby to perform the examining and positioning operations in accordance with all output information pieces obtained from said photoelectric conversion elements. Therefore, such output information is correctly judged to permit the performance of precise examining and positioning operations. Further, the apparatus using the method of the invention is so constructed as to permit a complete performance of the overall operations from the pellet selection to the non-qualified pellet detection and the pellet position determination. Therefore, the apparatus using the method of the invention has the merits that only qualified ones of the semiconductor members are positioned with high precision to permit an efficient performance of the operations; that since it is designed to process output information obtained from all the photoelectric conversion elements to obtain pellet information as to the rows and columns, information processing efficiency can be increased, and that an appropriate extent of permissible error can be determined with respect to pellet arrangement, pellet inclination, etc. by appropriately determining the number of "1" signals for determining whether or not the rows and columns of the optical image have an output.

The die bonding apparatus of the invention is designed to utilize the characteristics of the solid image sensor having the photoelectric conversion elements arranged in columns and rows into a matrix form thereby to perform the examining and positioning of a pellet to be processed in accordance with all information from such elements. Accordingly, the apparatus is freed from an undesirable effect resulting from a drift, or from undergoing a limitation of the information processing speed due to residual images, as in the conventional apparatus using a television camera, so that pellet information as to the columns and rows is quickly obtained with ease. Further, according to the apparatus of the invention, in examining and positioning a pellet, there is no need to perform the examining and positioning operation for such pellet with its portions likely to be damaged or broken especially taken into consideration. Therefore the apparatus of the invention enables a precise examining and positioning of the pellet as a whole and also permits the examining and positioning of a pellet damaged or broken to such an extent as permissible when it is put to practical use.

Further, the apparatus of the invention is based on the utilization of said optical image resulting from a from-above illumination, thereby to obtain the following effects: that an optical image on the illuminated effective surface is clear to obtain detailed information of the entire effective surface, thereby to correct such errors as made due to inclinations, irregularities, etc. at the cut edges of a pellet and also to permit an appropriate judgement as to examinations of its cracks, damages or stains. Such effects are not obtainable with conventional apparatuses.

Figure 7A:
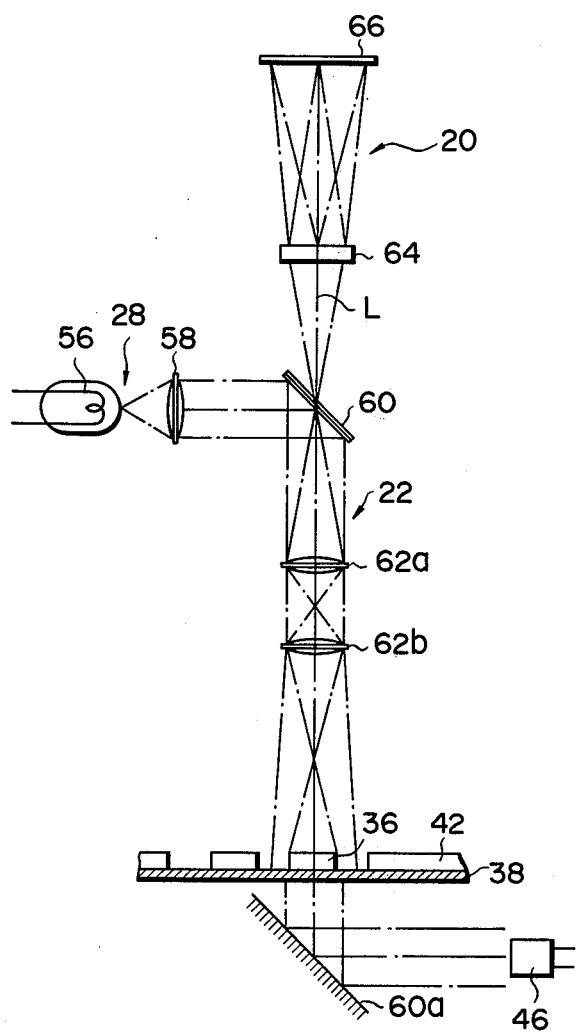
FIGS. 7a and 7b are views each for explaining an optical system of the FIG. 1 apparatus, wherein a boundary sensor is disposed at a position different from the sensor position in FIG. 3.
Figure 7B:
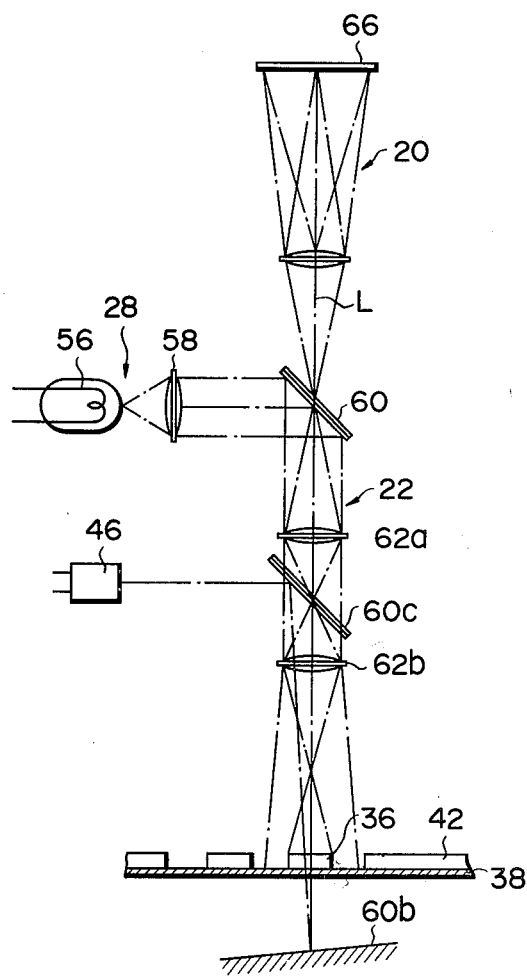

Further, in the method, and the apparatus using the same, of the invention, if provision is made of the boundary mark 42 surrounding a large number of said pellets 36 arranged on the transparent sheet 30 and also made of the boundary sensor 46 as shown in FIGS. 3, 7a and 7b and if such boundary mark 42 and boundary sensor 46 are operated as explained referring to said Figures, all the pellets 36 arranged within a region surrounded by the boundary mark 42 can automatically be examined in turn and, if qualified, can be positioned each in a normal or desired position. Accordingly, by providing the boundary mark 42 appropriately, it becomes unnecessary to seek for the pellet even up to a within sheet region where no pellet is disposed. That is, if only the XY table 30 is moved correspondingly to the region surrounded by the boundary mark 42, it will well serve the purpose, so that the operation efficiency can be increased by that extent.

What we claim is:

1. A method for positioning a semiconductor member by examining it, which examination is performed by focusing an optical image of the semiconductor member onto a photoelectric conversion face formed by arranging photoelectric conversion elements in rows and columns so as to take a matrix form, thereby to detect, by scanning both the distribution of first ones of said photoelectric conversion elements each producing an output signal when spotlighted by said optical image and the distribution of second ones of said photoelectric conversion elements each not producing an output signal when not spotlighted by said optical image, comprising:

(a) the step of setting a left reference column, right reference column, top reference row and bottom reference row on said photoelectric conversion face, thereby to determine, based on the detected distribution of the first and second ones of said photoelectric conversion elements, the number of columns in respective left and right column groups consisting respectively of columns consecutively arranged from said left and right reference columns, inclusive, toward said optical image and each having first ones of said photoelectric conversion elements of a number equal to or less than a specified value, and the number of rows in respective top and bottom row groups consisting respectively of rows consecutively arranged from said top and bottom reference rows, inclusive, toward said optical image and each having first ones of said photoelectric conversion elements of a number equal to or less than a specified value;

(b) the step of examining, using the number of rows and columns determined in step (a), whether or not an optical image of a semiconductor member is present on said photoelectric conversion face;

(c) the step of further examining, based on the detected distribution of the first and second ones of said photoelectric conversion elements, whether or not there are one or more optical images projected on said photoelectric conversion face;

(d) the step of selecting the semiconductor member to be further examined and positioned where there are a plurality of optical images examined in step (c) by using one optical image from among the optical images on said photoelectric conversion face, wherein said selecting step includes the step of determining, based on the detected distribution of the first and second photoelectric conversion elements, the number of columns in respective left and right column groups and the number of rows in respective top and bottom row groups and step of detecting, upon comparison between the number of columns in said left column group and said right column group and between the number of rows in said top row group and said bottom row group, one of the optical images which covers an area occupied by said column group having the greater number of columns and an area occupied by said row group having the greater number of rows;

(e) the step of examining, based on the detected distribution of the first and second photoelectric conversion elements and on the determined number of rows and number of columns, whether or not the semiconductor member corresponding to said one optical image judged to be present in said step (c) and selected in said step (d) is qualified; and (f) the step of positioning in a specified position said semiconductor member judged to be qualified in said step (e), and wherein the semiconductor member is an individual one of a plurality of semiconductor members arranged at prescribed intervals into rows and columns, said positioning step (f) including the automatic feed step of stepwise moving as a whole said plurality of semiconductor members thereby to perform the examining and positioning of each semiconductor member in turn, and wherein a boundary mark surrounds said plurality of semiconductor members, said automatic feed step including the step of stepwise moving said semiconductor members as a whole along one row or column direction for examining and positioning each member and subsequently stepwise moving said plurality of semiconductor members as a whole in a direction opposite to said one column or row direction upon detection of said boundary mark, said automatic feed step further including the step of detecting said boundary mark when the examining and positioning of each semiconductor member is performed along said column or row and an end of said column or row has been reached, totalizing the frequency at which said boundary mark is consecutively detected during the stepwise movement of said plurality of semiconductor members as a whole made immediately after said detection of said boundary mark, and, when said totalized value has reached a specified value, stopping the succeeding examining and positioning operation for the semiconductor member.

2. A method according to claim 1 in which said examining step (b) comprises judging whether or not said optical image is present on said photoelectric conversion face, in accordance with information as to whether or not at least either a sum of the respective number of columns of said left and right column groups or a sum of the respective number of rows of said top and bottom row groups is smaller than a specified value.

3. A method according to claim 1 in which said examining step (c) comprises judging a plurality of said optical images to be present within an area of said photoelectric conversion face defined by both said left and right reference columns and said top and bottom reference rows, when at least either one of the following two conditions is satisfied: (i) that both said left and right reference columns respectively have an output due to said optical images or (ii) that both said top and bottom reference rows respectively have an output due to said optical images.

4. A method according to claim 1 further comprising the step of affixing a defect-indicating mark on predetermined semiconductor members before said examining step (e) and wherein said examining step (e) includes the step of determining from columns and rows included respectively in intermediate column and row groups formed between said left and right column groups and between said top and bottom row groups, the respective numbers of the columns and rows where a respective each one of which has outputs due to said optical image of a number equal to or less than a specified value, and comparing respectively said determined numbers of columns and rows with a specified value, thereby to detect a semiconductor member having a defect-indicating mark.

5. A method according to claim 1 in which said examining step (e) includes the step of comparing with a specified value respectively a sum of the respective numbers of columns included in said left column group and columns included in said right column group and a sum of the respective numbers of rows included in said top row group and rows included in said bottom row group, thereby to examine whether or not the semiconductor member is qualified in terms of outer configuration and dimension.

6. A method according to claim 1 including the further step of determining the number of those photoelectric conversion elements each producing an output due to a portion of said optical image extending into two opposed columns and two opposed rows spaced from outer peripheral edges of said optical image by a predetermined respective number of columns and rows, and comparing the determined number of those photoelectric conversion elements with a specified value, thereby to examine whether or not the semiconductor member positioned in step (f) is partially excessive in size.

7. A method according to claim 1 in which said positioning step (f) includes the step of comparing respectively specified values with the respective numbers of columns of said left column group, columns of said right column group, rows of said top row group, and rows of said bottom row group, thereby to examine whether or not said optical image of the semiconductor member is located at a normal position on said photoelectric conversion face.

8. A method according to claim 1 in which said positioning step (f) includes the step of adding, in the case where the preceeding semiconductor member is conveyed exteriorly of said photoelectric conversion face without being positioned at a normal position and the immediately succeeding semiconductor member is simultaneously conveyed to a position for performing the examining and positioning of a semiconductor member, the amount of displacement of said preceeding semiconductor member from said normal position to a previously set amount of conveyance of a semiconductor member, thereby to convey said immediately succeeding semiconductor member to said position for the examining and positioning of a semiconductor member.

9. A method for positioning a semiconductor member by examining it, which is performed by focusing an optical image of the semiconductor member onto a photoelectric conversion face formed by arranging photoelectric conversion elements in rows and columns so as to take a matrix form, thereby to detect, by scanning both the distribution of first ones of said photoelectric conversion elements each producing an output signal when spotlighted by said optical image and the distribution of second ones of said photoelectric conversion elements each not producing an output signal when not spotlighted by said optical image, comprising:

(a) the step of setting a left reference column, right reference column, top reference row and bottom reference row on said photoelectric conversion face, thereby to determine, based on the detected distribution of the first and second ones of said photoelectric conversion elements, the number of columns in respective left and right column groups consisting respectively of columns consecutively arranged from said left and right reference columns, inclusive, toward said optical image and each having first ones of said photoelectric conversion elements of a number equal to or less than a specified value, and the number of rows in respective top and bottom row groups consisting respectively of rows consecutively arranged from said top and bottom reference rows, inclusive, toward said optical image and each having first ones of said photoelectric conversion elements of a number equal to or less than a specified value;

(b) the step of examining, using the number of rows and columns determined in step (a), whether or not an optical image of a semiconductor member is present on said photoelectric conversion face;

(c) the step of further examining, based on the detected distribution of the first and second ones of said photoelectric conversion elements, whether or not there are one or more optical images projected on said photoelectric conversion face;

(d) the step of selecting the semiconductor member to be further examined and positioned where there are a plurality of optical images examined in step (c) by using one optical image from among the optical images on said photoelectric conversion face, wherein said selecting step includes the step of determining, based on the detected distribution of the first and second photoelectric conversion elements, the number of columns in respective left and right column groups and the number of rows in respective top and bottom row groups and the step of detecting, upon comparison between the number of columns in said left column group and said right column group and between the number of rows in said top row group and between the number of rows in said top row group and said bottom row group, one of the optical images which covers an area occupied by said column group having the greater number of columns and an area occupied by said row group having the greater number of rows;

(e) the step of examining, based on the detected distribution of the first and second photoelectric conversion elements and on the determined number of rows and number of columns, whether or not the semiconductor member corresponding to said one optical image judged to be present in said step (c) and selected in said step (d) is qualified;

(f) the step of positioning in a specified position said semiconductor member judged to be qualified in said step (e); and (g) the step of determining from those photoelectric conversion elements within an area occupied by said optical image which exist within a region narrowed by respective numbers of specified columns and rows inwardly from an area defined by said left and right column groups and said top and bottom row groups, the number of those conversion elements producing no output signal resulting from no optical image, and comparing said determined number of those photoelectric conversion elements with a specified value, thereby to examine whether or not the semiconductor member positioned in step (f) is cracked, or is damaged, or is stained.

10. Apparatus for positioning a semiconductor member by examining it, the apparatus comprising a table for supporting a semiconductor member; means for driving said table in two-dimensional controlled movement, said driving means including a drive controller circuit; an optical examination system including a solid image sensor having a focusing face, and means for focusing onto the focusing face a reflected optical image of the semiconductor member, said focusing means including a light source, and said focusing face also including a plurality of photoelectric conversion elements arranged in a matrix array including first ones of said photoelectric conversion elements each producing an output signal when spotlighted by said optical image and second ones of said photoelectric conversion elements each not producing an output signal when not spotlighted by said optical image, said system also including means for detecting the distribution of said first ones and the distribution of said second ones of said photoelectric conversion elements, said detecting means including an interface circuit; and operation processing means including an operation processor interconnected with said interface circuit and with said drive controller circuit, said operation processing means also including:

(a) means for setting a left reference column, a right reference column, a top reference row and a bottom reference row on said photoelectric conversion face, thereby to determine, based on the detected distribution of the first and second ones of said photoelectric conversion elements, the number of columns in respective left and right column groups consisting respectively of columns consecutively arranged from said left and right reference columns, inclusive, toward said optical image and each having first ones of said photoelectric conversion elements of a number equal to or less than a specified value, and the number of rows in respective top and bottom row groups consisting respectively of rows consecutively arranged from said top and bottom reference rows, inclusive, toward said optical image and each having first ones of said photoelectric conversion elements of a number equal to or less than a specified value;

(b) means for examining, using the number of rows and columns determined in (a), whether or not an optical image of a semiconductor member is present on said photoelectric conversion face;

(c) means for further examining, based on the detected distribution of said first and said second ones of said photoelectric conversion elements, whether or not there are one or more optical images projected on said photoelectric conversion face;

(d) means for selecting the semiconductor member to be further examined and positioned where there are a plurality of optical images examined in (c) by using one optical image from among the optical images on said photoelectric conversion face, including means for determining, based on the detected distribution of said first ones and said second ones of said photoelectric conversion elements, the number of columns in respective left and right column groups and the number of rows in respective top and bottom row groups, and means for detecting, upon comparison between the number of columns in said left column group and said right column group and between the number of rows in said top row group and said bottom row group, one of the optical images which covers an area occupied by said column group having the greater number of columns and an area occupied by said row group having the greater number of rows;

(e) means for examining, based on the detected distribution of said first and said second ones of said photoelectric conversion elements and on the determined number of rows and number of columns, whether or not the semiconductor member corresponding to said one optical image judged to be present in (c) and selected in (d) is qualified; and (f) means for positioning in a specified position said semiconductor member judged to be qualified in (e); and wherein the semiconductor member is an individual one of a plurality of semiconductor members arranged at prescribed intervals into rows and columns on said table, and wherein a boundary mark surrounds said plurality of semiconductor members, the apparatus further including sensor means for detecting said boundary mark, said sensor means including a light-activated boundary sensor and a binary coding circuit interconnecting said boundary sensor with said operation processor through said interface circuit, said operation processing means also including means for automatically feeding by stepwise moving said table with said plurality of semiconductor members as a whole along one row or column direction for examining and postioning each member and subsequently stepwise moving said table with said plurality of semiconductor members as a whole in a direction opposite to said one column or row direction upon detecting of said boundary mark by said sensor means, said operation processing means also including means for detecting said boundary mark when the examining and positioning of each semiconductor member is performed along said column or row and when an end of said column or row has been reached, totalizing the frequency at which said boundary mark is consecutively detected during the stepwise movement of said table with said plurality of semiconductor members as a whole made immediately after said detection of said boundary mark, and, when said totalized value has reached a specified value, stopping the succeeding examining and positioning operation for the plurality of semiconductor members.

11. Apparatus according to claim 10 in which said boundary sensor is disposed on a light axis of said optical system.

12. Apparatus according to claim 10 in which a mirror is disposed on a light axis of said optical system in a manner inclined at an appropriate angle to said light axis; and said boundary sensor is disposed in the advancing direction of a light reflected from said mirror.

13. Apparatus according to claim 10 which further comprises a semi-transparent mirror disposed on a light axis of said optical system in a manner inclined at an appropriate angle to said light axis and a mirror disposed on said light axis in a manner inclined at an appropriate angle thereto; and said boundary sensor is disposed in a direction in which a light reflected from said mirror advances after being further reflected from said semi-transparent mirror.

14. The apparatus as in claim 10 for use in a die-bonding system that includes a lead-frame and means for securing a semiconductor member to the lead-frame, the apparatus further comprising means for conveying the examined and positioned semiconductor member from said table to the securing means, said conveying means including a picking-up mechanism operatively connected to said operation processing means, said operation processing means also including means for activating said picking-up mechanism to pick up an examined and positioned semiconductor member and for indexing said table to examine and position another one of said plurality of semiconductor members when the operation of said picking-up mechanism has been completed.

* * * * *